(12) United States Patent
Kim

(10) Patent No.: US 6,696,722 B1
(45) Date of Patent: Feb. 24, 2004

(54) STORAGE NODE OF DRAM CELL

(75) Inventor: Hyoung-Sub Kim, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/708,957

(22) Filed: Nov. 8, 2000

Related U.S. Application Data

(62) Division of application No. 09/332,474, filed on Jun. 14, 1999, now Pat. No. 6,168,990.

(30) Foreign Application Priority Data

Jun. 15, 1998 (KR) ............................................. 98-22432

(51) Int. Cl.⁷ ........................ H01L 27/108; H01L 29/76; H01G 4/06
(52) U.S. Cl. ..................... 257/308; 257/309; 361/321.4
(58) Field of Search ............................. 257/296, 306, 257/308, 309; 361/321.4

(56) References Cited

U.S. PATENT DOCUMENTS 5,825,609 A * 10/1998 Andricacos et al. ...... 361/321.4

FOREIGN PATENT DOCUMENTS

| JP | 5-283613 | * 10/1993 | ................. 257/308 |
| JP | 6-151755 | * 5/1994 | ................. 257/308 |

* cited by examiner

Primary Examiner—Steven Loke
(74) Attorney, Agent, or Firm—Cantor Colburn LLP

(57) ABSTRACT

A storage node of a DRAM cell capacitor includes a first insulating layer in which a bit line pattern is formed, a second insulating layer formed on the first insulating layer of which material is different from that of the second insulating layer, a first conductive layer formed on the second insulating layer that has an etching rate different from that of the first conductive layer, a material layer formed on the first conductive layer, which has a smaller width than the first conductive layer and is made of material with different etching characteristics from that of the first conductive layer, a second conductive layer that is formed on the material layer and has the same width as that of the material layer, and a sidewall conductive spacer that is an contact with the second conductive layer and the material layer and is formed on the top surface of the first conductive layer and on sides of the material layer and the second conductive layer.

9 Claims, 3 Drawing Sheets

STORAGE NODE OF DRAM CELL

This application is a divisional application of U.S. patent Ser. No. 09/332,474, filed Jun. 14, 1999, now U.S. Pat. No. 6,168,990, which is herein incorporated by reference in its entirety.

FIELD OF THE INVENTION

The present invention relates to a method for fabricating a DRAM cell capacitor, and more particularly to a method for fabricating a storage node thereof.

BACKGROUND OF THE INVENTION

In a dynamic random access memory (DRAM) device, the cell capacitance which is closely related to the product quality, may require a higher value than in a normal cell, for example, a 25 tF/cell. It is required that the value be higher.

Since the design rule becomes smaller as the cell density increases, a practical process margin, for example, an overlap margin between a storage node and contact plug is reduced. Accordingly, the height of the storage node is increased to obtain great capacitance in a small area.

FIG. 1 shows a structure of a storage node 10 of a conventional DRAM cell capacitor and FIG. 2 shows an associated problem which arises due to the misalignment of storage node 10 of the conventional DRAM cell capacitor.

Referring to FIG. 1 the structure for a storage node 10 of conventional 1G DRAM and 256M DRAM products is illustrated. Two insulating layers 2 and 6 are formed on a semiconductor substrate (not shown). Two bit line patterns 4a and 4b are formed in the insulating layers 2 and 6. A storage node contact hole 8 is formed to expose a portion of the semiconductor substrate by penetrating the insulating layers 2 and 6 between the bit line patterns 4a and 4b. Storage node 10 is formed on the insulating layers 2 and 6 including the contact hole 8.

In an exemplary 0.34 pitch cell the size 'A' of the contact hole 8 is about 100~130 nm and the top size 'B' of the storage node 10 is about 160 nm. As a result an overlap margin of the storage node 10 to the contact hole 8 is about 15~30 nm/side. The height 'H' of the storage node 10 may be formed with a thickness of about 10,000 Å to receive the desired cell capacitance.

It takes a considerable time to deposit undoped polysilicon, which is generally used to form the storage node 10, due to above reasons. If the storage node 10 is misaligned, as shown in FIG. 2, an under-cut portion 12 is formed by over-etching. Subsequently, the falling-down of the storage node 10 may occur during a subsequent cleaning process.

SUMMARY OF THE INVENTION

The present invention addresses and overcomes the above-mentioned deficiencies of the prior art It is therefore an object of the invention to provide a method for fabricating a DRAM cell capacitor which can reduce the thickness of a polysilicon to form a storage node with the height of the storage node being maintained. In other words, the cell capacitance is maintained.

It is another object of the invention to provide a method for fabricating a DRAM cell capacitor which can minimize the total etch amount of a polysilicon layer for forming a storage node and prevent falling-down thereof generated by over-etching, a subsequent cleaning process, etc., despite the misalignment thereof.

According to these objects of this invention, the method includes forming a first insulating layer on a semiconductor substrate; forming a conductive layer pattern for forming bit lines on the first insulating layer; forming a second insulating layer to cover up the first insulating layer and bit line patterns; etching the second and first insulating layers of a region between bit line patterns to form a storage node contact hole; forming sequentially a first conductive layer, material layer, and second conductive layer on the second insulating layer including the contact hole, the material layer having an etching selectivity with respect to the first conductive layer; patterning the second conductive layer and material layer by using a mask for forming a storage node; forming a third conductive layer on the first conductive layer including the second conductive layer pattern and material layer pattern; and forming a poly-spacer on both side-walls of the second conductive layer pattern and material layer pattern by etching back the third conductive layer and first conductive layer thereunder to expose a surface of the second insulating layer, so that a storage node is formed by the first, second, and third conductive layers.

In a preferred embodiment of the present invention, the first, second, and third conductive layer are made of polysilicon.

In a preferred embodiment of the present invention, the first, second, and third conductive layer have a thickness of about 100~10,000 Å. Preferably, the first conductive layer has a thickness of about 500~5,000 Å. Preferably, the second conductive layer has a thickness range of about 500~5,000 Å and the third conductive layer has a thickness of about 100~3,000 Å.

In a preferred embodiment of the present invention, the material layer is either an insulating layer or conductive layer.

In a preferred embodiment of the present invention, the insulating layer is an oxide layer deposited relatively fast by either an APCVD (atmospheric pressure chemical vapor deposition) method or LPCVD (low pressure chemical vapor deposition) method.

In a preferred embodiment of the present invention, the conductive layer is made of one selected from a group consisting of W, TiN, W silicide, and Ti silicide.

In a preferred embodiment of the present invention, the material layer has a thickness of about 2,000~30,000 Å.

Referring to FIG. 3D, insulating layers formed on a semiconductor substrate are etched to form a storage node contact hole. A first conductive layer, material layer, and second conductive layer are sequentially formed wherein the material layer has an etching selectivity with respect to the first conductive layer. The second conductive layer and material layer are patterned by a mask for forming the storage node. A third conductive layer is formed on the first conductive layer including the second conductive layer pattern and material layer pattern. The third conductive layer and the first conductive layer thereunder are etched back to form a poly-spacer. A storage node is formed by the fist, second, and third conductive layer, thereby decreasing the thickness of a storage node polysilicon layer with the height of an existing storage node, that is, cell capacitance maintained and reducing the process throughput as well as minimizing the total etch amount of the polysilicon layer for forming a storage node during formation thereof. In addition the present invention reduces the over-etch amount of the polysilicon layer, and prevents the falling-down of a storage node generated by an over-etch and a subsequent cleaning process despite the misalignment of the storage node.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE PREFERRED EMBODIMENTS

Figure 1:
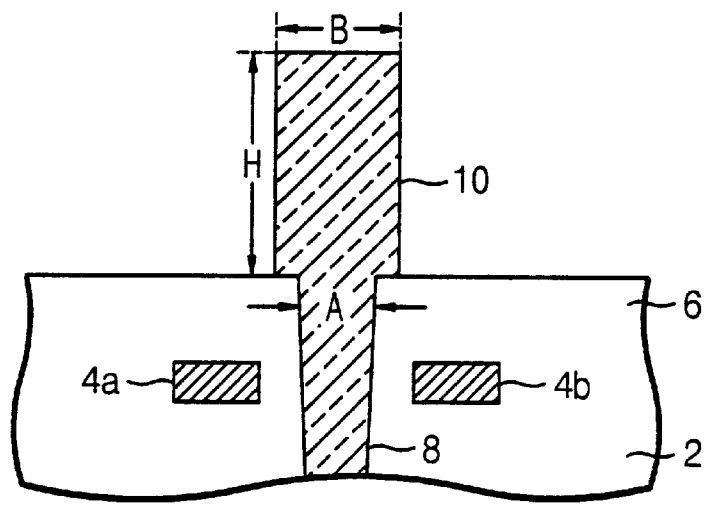
FIG. 1 is a cross-sectional view showing a structure of a storage node of a conventional DRAM cell capacitor.
Figure 2:
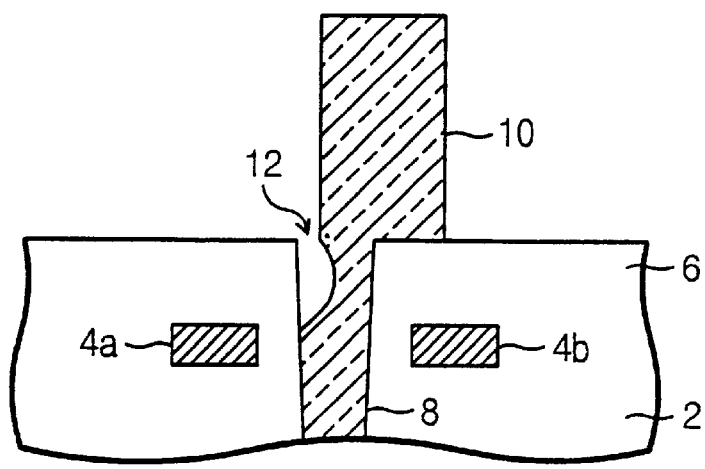
FIG. 2 is a cross-sectional view showing a problem owing to the misalignment of a storage node of a conventional DRAM cell capacitor.

Now, the present invention will be described in greater detail in conjunction with a preferred or exemplary embodiment by reference to the accompanying drawings.

FIGS. 3A to 3D sequentially show a method for fabricating a storage node of a DRAM cell capacitor according to the present invention.

Referring to 3A, a first insulating layer 100 having a planar top surface is formed on a semiconductor substrate (not shown). Two conductive patterns 102a, 102b for forming bit lines are formed on the first insulating layer 100. A second insulating layer 104 having a planar top surface is formed to cover up the first insulating layer 100 and bit line patterns 102a, 102b. The first insulating layer 100 and second insulating layer 104 are made of, for example, an oxide. A third insulating layer 106 is optionally formed on the second insulating layer 104. The third insulating layer 106 is made of, for example, a material such as an oxide or silicon nitride having a good etching selectivity with respect to a first polysilicon layer 110 which is formed by a following process. The etching selectivity of the polysilicon to oxide is better than that of the polysilicon to silicon nitride. The silicon nitride is conventionally used to prevent oxidation of the bit line patterns 102a, 102b. The third insulating layer 106 is formed to a thickness of about 100~10,000 Å.

The third insulating layer 106, second insulating layer 104, and first insulating layer 100 of a portion between the bit line patterns 102a, 102b are sequentially etched to form a storage node contact hole 108.

A first polysilicon layer 10 for forming a storage node 118 is formed on the third insulating layer 106 including the contact hole 108. The first polysilicon layer 110 is formed to a thickness of about 100~10,000 Å, preferably about 500~5,000 Å.

A material layer 112 is formed on the first polysilicon layer 110. The material layer 112 is, for example, a conductive layer or insulating layer such as an oxide layer having an etching selectivity with respect to the first polysilicon layer 110. If the material layer 112 is an oxide layer, the process throughput is reduced because the oxide layer is rapidly deposited by an APCVD (atmospheric pressure chemical vapor deposition) or LPCVD (low pressure chemical vapor deposition) method. Furthermore, if the material layer 112 is a conductive layer comprising one selected from a group consisting of W, TiN, W silicide, and Ti silicide, the sheet resistance of the storage node 118 is reduced. The material layer 112 is formed to a thickness of about 2,000~30,000 Å.

A second polysilicon 114 for forming a storage node 118 is formed on the material layer 112. The second polysilicon 114 is formed to a thickness of about 100~10,000 Å, preferably, about 500~5,000 Å.

Figure 3A:
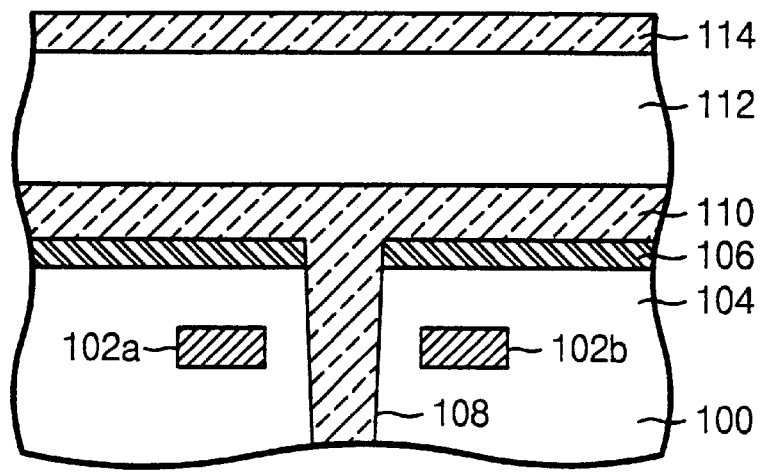
FIGS. 3A to 3D are cross-sectional views showing a method for fabricating a storage node of a DRAM cell capacitor according to the present invention.
Figure 3B:
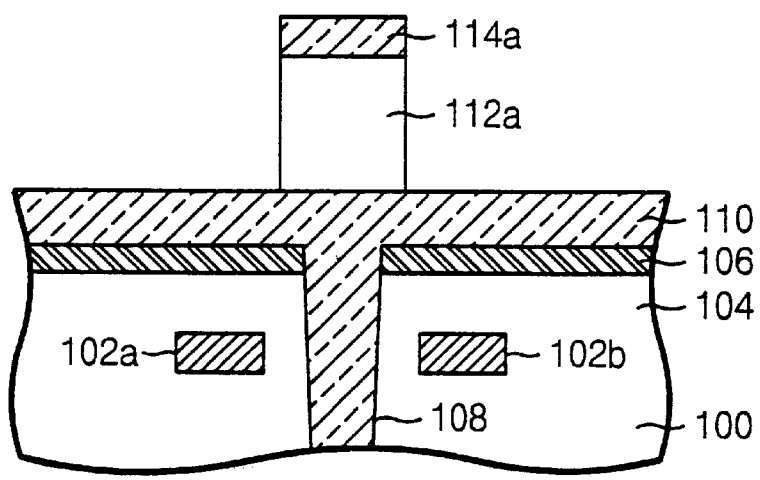

Referring to FIG. 3B, the second polysilicon layer 114 and material layer 112 is patterned by using a mask for the storage node 118. In one exemplary embodiment, the mask comprises a photoresist pattern. Then, the first polysilicon layer 110 becomes an etch stop layer while the material layer 112 is etched.

Figure 3C:
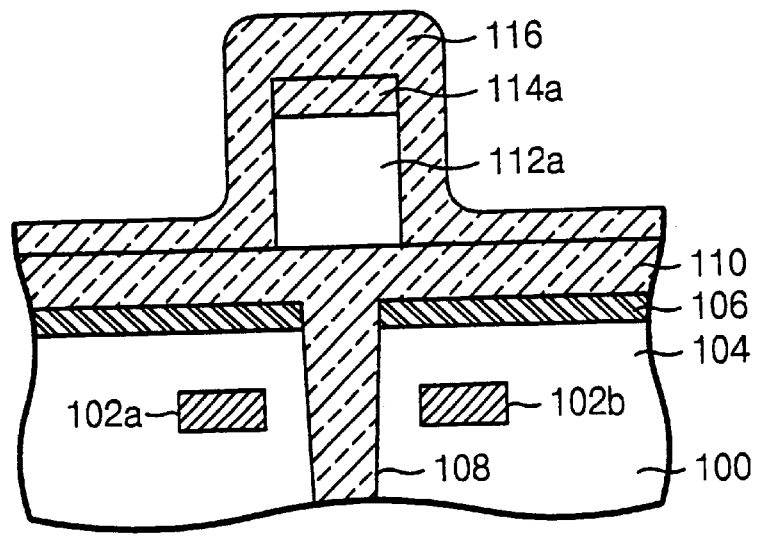

Referring to FIG. 3C, a third polysilicon layer 116 for forming the storage node 118 is formed on the first polysilicon layer 110 including the second polysilicon layer pattern 114a and material layer pattern 112a. The third polysilicon layer 116 is formed to a thickness of about 100~10,000 Å, preferably, about 100~3,000 Å.

Finally, the third polysilicon layer 116 and the first polysilicon layer 110 thereunder are etched back until a top surface of the third insulating layer 106 is exposed.

Figure 3D:
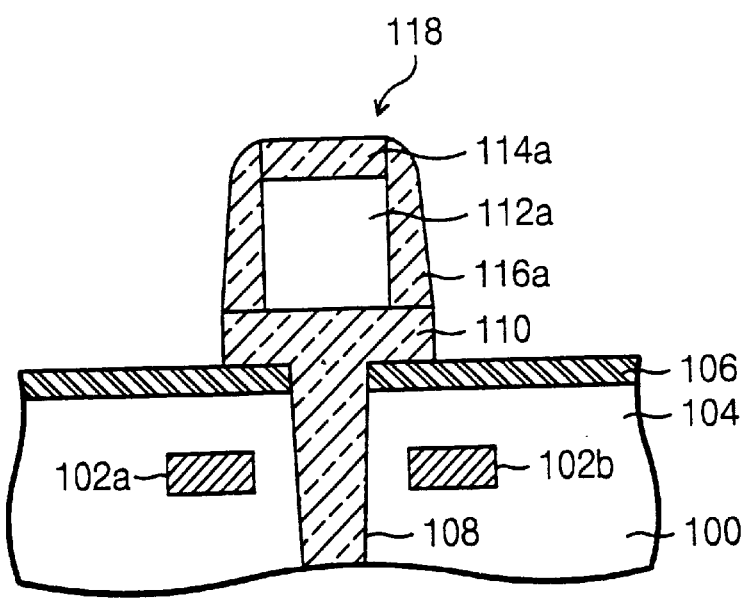

Accordingly, a poly-spacer 116a is formed on both sidewalls of the second polysilicon layer pattern 114a and material layer pattern 112a. The second polysilicon layer pattern 114a remains and has a predetermined thickness. As a result, as shown in FIG. 3D, a storage node 118 of a DRAM cell capacitor is made to be generally in the form of a box in which the material layer pattern 112a is surrounded by the first polysilicon layer 110, second polysilicon layer 114a, and the poly-spacer 116a as the third polysilicon layer. The cell capacitance of the DRAM cell capacitor may be related to a surface area of the storage node and is maintained over the existing cell capacitance.

In a prior method for forming a storage node, if the thickness of a polysilicon layer for forming a storage node is, for example, 10,000 Å, the total etch amount is about 15,000 Å considering an over-etch of 50%. That is, the over-etch amount is 5,000 Å. According to the present invention, however, if the thickness of the first polysilicon layer 110 is, for example, about 1,000 Å and the thickness of the third polysilicon layer 116 is about 1,000 Å, the total etch amount of the polysilicon layer for forming a storage node is just about 3,000 Å despite consideration of an over-etch of 50% during an etch back process. That is, the over-etch amount of the polysilicon layer for forming the storage node is reduced to be about 1,000 Å.

This invention solves the increase of over-etch amount in proportion to the increase of the height of a prior storage node and the falling-down of a storage node generated by an over-etch and subsequent cleaning process when misalignment thereof has occurred. This results in a decrease of the thickness of the storage node polysilicon layer with the height of an existing storage node being maintained. In other words in the present invention, the cell capacitance is maintained and the process throughput is reduced and the present invention minimizes the total etch amount of a polysilicon layer for forming a storage node during formation thereof, thereby reducing the over-etch amount thereof, and preventing the falling-down of a storage node generated by an over-etch and subsequent cleaning process despite the misalignment of the storage node.

What is claimed is:

1. A storage node of a DRAM cell capacitor comprising:
   a first insulating layer in which a bit line pattern is formed;
   a second insulating layer formed on the first insulating layer, material of the second insulating layer being different from material of the first insulating layer;
   a first conductive layer formed on the second insulating layer, wherein entire top surface of the first conductive layer is planar;

a material layer formed on the first conductive layer, having a smaller width than the first conductive layer, wherein entire top surface and entire bottom surface of the material layer are planar, and the material layer and the first conductive layer are made of different materials having different etching characteristics such that the first conductive layer serves as a etch stop layer in etching the material layer;

a second conductive layer formed on the material layer, having the same width as the material layer; and a side wall conductive spacer in contact with the second conductive layer and the material layer, the sidewall conductive spacer formed on the top surface of the first conductive layer and on sides of the material layer and the second conductive layer, wherein the width of the first conductive layer is equal to a sum of the width of the material layer and two times a bottom width of the sidewall conductive spacer, and wherein the second insulating layer has an etching rate different from an etching rate of the first conductive layer.

2. The storage node according to claim 1, wherein a bottom of a storage node contact integrated with the first conductive layer is electrically connecting to an active region of a semiconductor substrate, the storage node contact being formed in the first insulating layer.

3. The storage node according to claim 1, wherein the first and second conductive layers and the sidewall spacer are made of polysilicon.

4. The storage node according to claim 1, wherein the material layer is made of insulating material.

5. The storage node according to claim 4, wherein the insulating material comprises an oxide formed by a chemical vapor deposition technique.

6. The storage node according to claim 1, wherein the material layer is made of conductive material.

7. The storage node according to claim 6, wherein the conductive material comprises at least one selected from the group consisting of tungsten, titanium nitride, tungsten silicide and titanium silicide.

8. The storage node according to claim 1, wherein the material of the first insulating layer is oxide and the material of the second insulating layer is silicon nitride.

9. The storage node according to claim 1, wherein the first insulating layer includes two sub-layers having two bit line patterns.

\* \* \* \* \*